(12) United States Patent
Terada et al.

(10) Patent No.: US 8,705,680 B2
(45) Date of Patent: Apr. 22, 2014

(54) CDR CIRCUIT

(75) Inventors: Jun Terada, Kanagawa (JP); Yusuke Ohtomo, Kanagawa (JP); Kazuyoshi Nishimura, Kanagawa (JP); Tomoaki Kawamura, Kanagawa (JP); Minoru Togashi, Kanagawa (JP); Keiji Kishine, Kanagawa (JP)

(73) Assignee: Nippon Telegraph and Telephone Corporation, Chiyoda-Ku, Tokyo (JP)

( * ) Notice: Subject to any disclaimer, the term of this patent is extended or adjusted under 35 U.S.C. 154(b) by 1512 days.

(21) Appl. No.: 12/308,503

(22) PCT Filed: Jun. 27, 2007

(86) PCT No.: PCT/JP2007/062912
§ 371 (c)(1),
(2), (4) Date: Dec. 16, 2008

(87) PCT Pub. No.: WO2008/001811
PCT Pub. Date: Jan. 3, 2008

(65) Prior Publication Data
US 2010/0232558 A1    Sep. 16, 2010

(30) Foreign Application Priority Data

Jun. 29, 2006  (JP) ................................ 2006-179533
Mar. 30, 2007  (JP) ................................ 2007-092334

(51) Int. Cl.
*H03D 3/24*    (2006.01)
(52) U.S. Cl.
USPC .......................................... 375/375; 375/373
(58) Field of Classification Search
None
See application file for complete search history.

(56) References Cited

U.S. PATENT DOCUMENTS

| | | | | |
|---|---|---|---|---|
| 4,426,627 A | * | 1/1984 | Yoshisato et al. | ................ 331/12 |
| 4,785,260 A | * | 11/1988 | Paneth | ............................. 331/2 |
| 5,025,461 A | * | 6/1991 | Pauer | ............................ 375/373 |
| 5,365,485 A | * | 11/1994 | Ward et al. | ............... 365/189.15 |
| 5,818,304 A | * | 10/1998 | Hogeboom | ...................... 331/11 |
| 5,920,530 A | * | 7/1999 | Kuroda et al. | ............. 369/47.32 |
| 5,937,021 A | * | 8/1999 | Pereira et al. | ................. 375/376 |

(Continued)

FOREIGN PATENT DOCUMENTS

| | | |
|---|---|---|
| CN | 1608360 A | 4/2005 |
| JP | 61-009059 A | 1/1986 |
| JP | 63-224540 A | 9/1988 |
| JP | 04-322532 | 11/1992 |

OTHER PUBLICATIONS

Ota et al., "High-Speed, Burst-Mode, Packet-Capable Optical Receiver and Instantaneous Clock Recovery for Optical Bus Operation", IEEE Journal of Lightwave Technology, vol. 12, No. 2, pp. 325-331, Feb. 1994.

*Primary Examiner* — Shuwang Liu
*Assistant Examiner* — Gina McKie
(74) *Attorney, Agent, or Firm* — Blakely Sokoloff Taylor & Zafman

(57) ABSTRACT

A recovered clock (123) is generated by making the phase of a reference clock (122) having the same frequency as the data rate frequency of input data (120) match the phase of the input data (120). The input data (120) is written in a FIFO (101) using the recovered clock (123). For readout from the FIFO (101), the FIFO (101) is caused to output recovered data (121) using the reference clock (122) asynchronous to the recovered clock (123).

9 Claims, 9 Drawing Sheets

(56) References Cited

U.S. PATENT DOCUMENTS

| | | | |
|---|---|---|---|
| 5,955,928 A * | 9/1999 | Smith et al. | 331/2 |
| 6,289,022 B1 * | 9/2001 | Gale et al. | 370/412 |
| 7,050,777 B2 * | 5/2006 | Cai | 455/295 |
| 7,071,848 B1 * | 7/2006 | Khu | 341/51 |
| 7,098,754 B2 * | 8/2006 | Humphreys et al. | 332/103 |
| 7,102,446 B1 * | 9/2006 | Lee et al. | 331/11 |
| 2002/0075980 A1 * | 6/2002 | Tang et al. | 375/372 |
| 2004/0013217 A1 * | 1/2004 | Dietrich et al. | 375/372 |

* cited by examiner

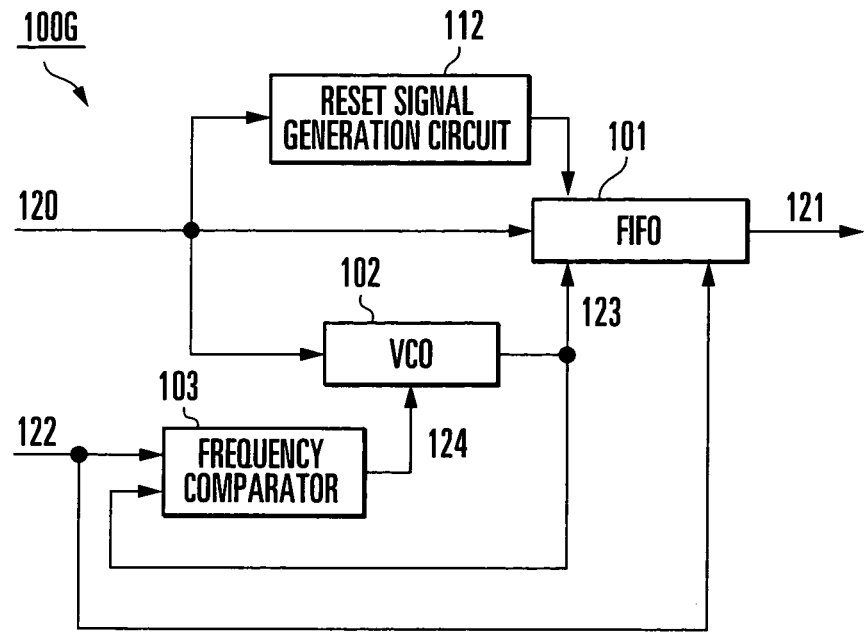
F I G. 7
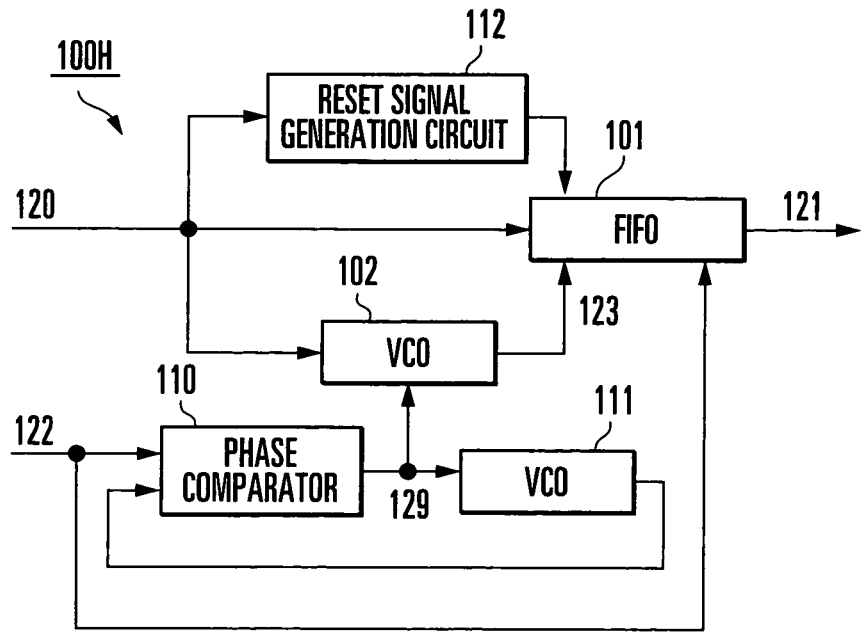
F I G. 8

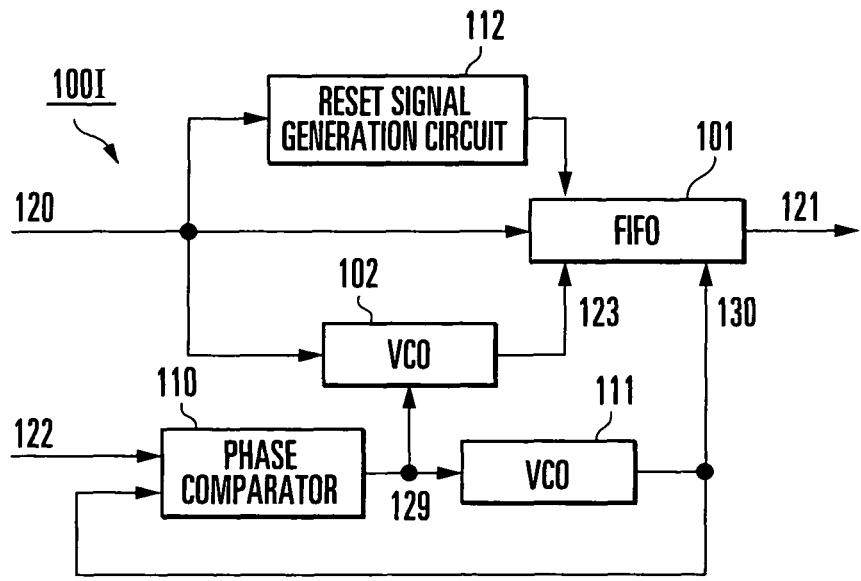
F I G. 9
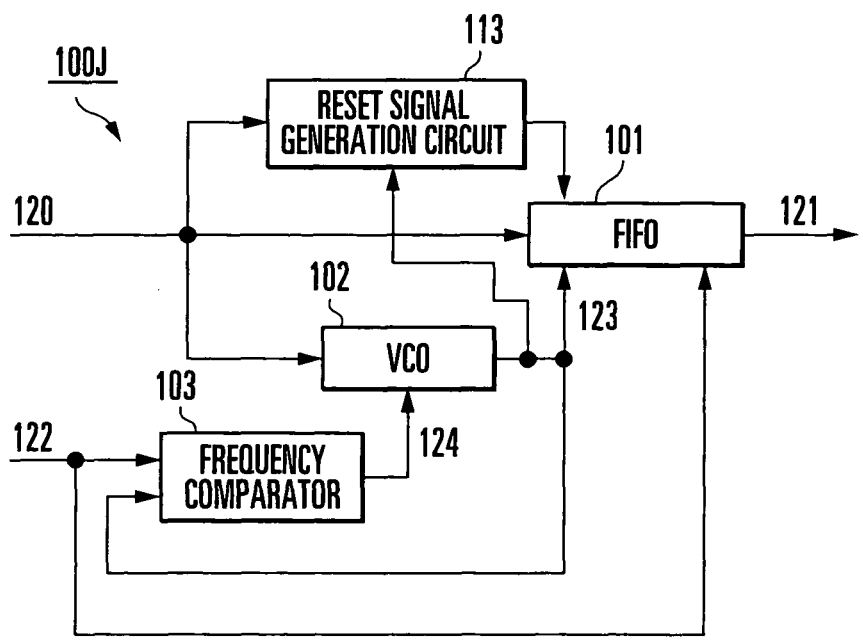
F I G. 10

CDR CIRCUIT

The present patent application is a Utility claiming the benefit of Application No. PCT/JP2007/062912, filed Jun. 27, 2007.

TECHNICAL FIELD

The present invention relates to a CDR (Clock Data Recovery) circuit which extracts a clock in phase with input data and retimes the input data based on the clock.

BACKGROUND ART

It is necessary to handle burst data in, e.g., PON (Passive Optical Network) systems that have been developed as a technique of implementing FTTH (Fiber To The Home). In these systems, a CDR circuit is indispensable which instantaneously establishes phase lock with asynchronously received burst data, extracts a clock in phase with the burst data, and outputs the data retimed in synchronous with the clock. A circuit of this type is disclosed in, e.g., reference, Yusuke Ota et al., "High-Speed, Burst-Mode, Packet-Capable Optical Receiver and Instantaneous Clock Recovery for Optical Bus Operation", IEEE Journal of Lightwave Technology, Vol. 12, No. 2, pp. 325-331, February 1994.

FIG. 17 shows an example of the arrangement of a CDR circuit 200 used for this application purpose. Reference numeral 201 denotes a flip-flop; 202, a main VCO (Voltage Controlled Oscillator); 203, a sub VCO, and 204, a phase comparator. The phase comparator 204 compares a reference clock 222 having the same frequency as a data rate frequency f1 of input data 220 with the phase of the oscillation output of the sub VCO 203, and outputs a frequency control signal 224 which makes the phases match. The frequency control signal 224 is input to the main VCO 202 and the sub VCO 203. Hence, the frequency of a recovered clock 223 output from the main VCO 202 is the same as that of the reference clock 222. The main VCO 202 receives the input data 220 and performs adjustment to make the phase of the recovered clock 223 match with that of the data 220 using the voltage transition point of the input data 220 as a trigger. The recovered clock 223 in phase with the input data 220 is used to retime the input data 220 in the flip-flop 201. The data 220 input to the flip-flop 201 is adjusted using a stationary delay circuit (not shown) to reliably extract a clock.

DISCLOSURE OF INVENTION

Problem to be Solved by the Invention

The arrangement of the CDR circuit shown in FIG. 17 makes the phase of the recovered clock match that of the input data. For this reason, if the input data contains jitter (phase noise), the recovered data also contains jitter.

It is an object of the present invention to provide a CDR circuit capable of solving the problem of jitter in recovered data.

Means of Solution to the Problem

According to the present invention, there is provided a CDR circuit comprising a recovered clock generation circuit which receives a first reference clock having the same frequency as a data rate frequency of input data and generates a recovered clock in phase with the input data, and a data write/read circuit which writes the input data using the recovered clock as a write clock, and reads out the input data using, as a read clock, a clock which has the same frequency as the recovered clock and is asynchronous to the recovered clock.

Effect of the Invention

As described above, according to the present invention, input data is written in a data write/read circuit based on a recovered clock in phase with the input data. Data read from the data write/read circuit is done using another clock asynchronous to the recovered clock. Hence, recovered data output from the data write/read circuit is never affected by jitter in the input data. The present invention can solve the problem of jitter in recovered data in this way.

BRIEF DESCRIPTION OF DRAWINGS

FIG. 7 is a block diagram showing the arrangement of a CDR circuit according to the seventh embodiment of the present invention;

FIG. 8 is a block diagram showing the arrangement of a CDR circuit according to the eighth embodiment of the present invention;

FIG. 9 is a block diagram showing the arrangement of a CDR circuit according to the ninth embodiment of the present invention;

FIG. 10 is a block diagram showing the arrangement of a CDR circuit according to the 10th embodiment of the present invention;

BEST MODE FOR CARRYING OUT THE INVENTION

First Embodiment

Figure 1:
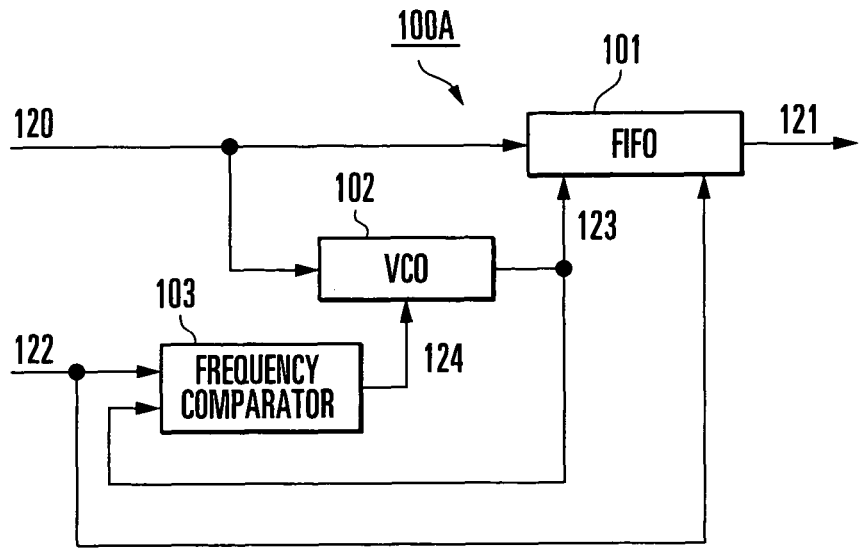
FIG. 1 is a block diagram showing the arrangement of a CDR circuit according to the first embodiment of the present invention.

FIG. 1 shows the arrangement of a CDR circuit 100A according to the first embodiment of the present invention. Referring to FIG. 1, reference numeral 101 denotes a FIFO (First-In First-Out); 102, a VCO; 103, a frequency comparator; 120, input data; 121, recovered data; and 122, a reference clock. The VCO 102 and the frequency comparator 103 form a PLL (Phase-Locked Loop) circuit and a recovered clock generation circuit. The FIFO 101 forms a data write/read circuit.

The frequency of the reference clock 122 is the same as the data rate frequency of the input data 120. The frequency comparator 103 compares the frequency of the reference clock 122 with that of an output clock (recovered clock) 123 from the VCO 102. For example, the frequency comparator 103 compares the number of reference clocks 122 counted per predetermined time with the number of recovered clocks 123 from the VCO 102 counted per predetermined time and outputs a frequency control signal 124 corresponding to the count difference (frequency difference).

The data 120 input from the data input terminal is input to the FIFO 101 and the VCO 102. The frequency comparator 103 compares the frequency of the recovered clock 123 output from the VCO 102 with that of the reference clock 122, and inputs the frequency control signal 124 corresponding to the frequency difference to the frequency control terminal of the VCO 102. Hence, the frequency of the recovered clock 123 output from the VCO 102 is equal to that of the reference clock 122. The input burst data 120 is input to the phase control terminal of the VCO 102. The VCO 102 performs adjustment to make the phase of the recovered clock 123 match that of the data 120 using the voltage transition point of the data 120 as a trigger. The recovered clock 123 in phase with the data 120 is used to write the data 120 in the FIFO 101.

On the other hand, the reference clock 122 is input to the FIFO 101 directly as a read clock without phase adjustment. The FIFO 101 stores the input data 120 using the recovered clock 123 and outputs the stored input data 120 in the input order using the reference clock 122. Hence, the recovered data 121 output from the FIFO 101 is never affected by jitter contained in the input data 120.

Second Embodiment

Figure 2:
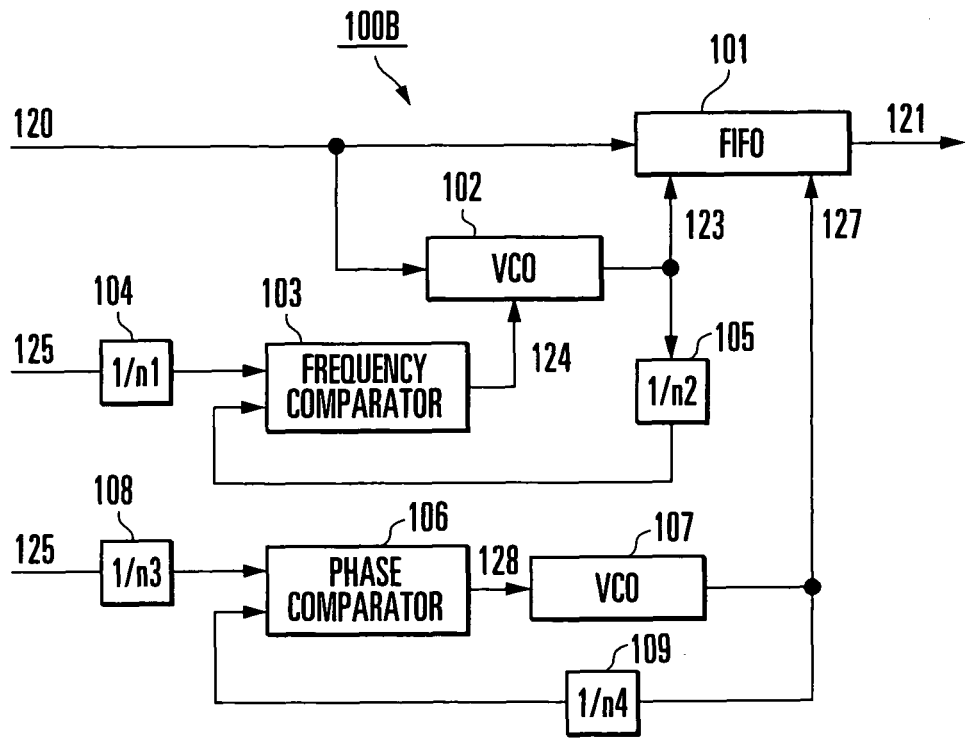
FIG. 2 is a block diagram showing the arrangement of a CDR circuit according to the second embodiment of the present invention.

FIG. 2 shows the arrangement of a CDR circuit 100B according to the second embodiment of the present invention. The same reference numerals as in FIG. 1 denote the same constituent elements in FIG. 2. In this embodiment, frequency dividers 104 and 105 are inserted to both input sides of a frequency comparator 103 in the CDR circuit 100A shown in FIG. 1. A phase comparator 106 and a VCO 107, which form a PLL circuit, are newly added. Frequency dividers 108 and 109 are also inserted to both input sides of the phase comparator 106. Reference numerals 125 and 126 denote reference clocks.

To generate a recovered clock 123 for write in a FIFO 101, the reference clock 125 is used. Let f2 be the frequency of the reference clock 125, f1 be the frequency of the write clock for the FIFO 101, n1 be the frequency dividing ratio of the frequency divider 104, and n2 be the frequency dividing ratio of the frequency divider 105. The frequency dividing ratios n1 and n2 are set to satisfy $$f2/n1 = f1/n2$$

As a result, even when the frequency of the reference clock 125 is different from the data rate frequency f1 of input data 120, the frequency of the recovered clock 123 from a VCO 102 can match the frequency f1. That is, the degree of freedom in selecting the reference clock 125 can be raised by setting the frequency dividing ratios n1 and n2 in accordance with the frequency of the reference clock 125 to be used. In this embodiment, the frequency to be handled by the frequency comparator 103 is lower. This reduces the operation speed of the frequency comparator 103 and therefore enables power saving.

On the other hand to generate a read clock 127 for the FIFO 101, the reference clock 126 is used. The phase comparator 106 outputs a frequency control signal 128 corresponding to the phase difference between the two input clocks. Let f3 be the frequency of the reference clock 126, f1 be the frequency of the read clock 127, n3 be the frequency dividing ratio of the frequency divider 108, and n4 be the frequency dividing ratio of the frequency divider 109. The frequency dividing ratios n3 and n4 are set to satisfy $$f3/n3 = f1/n4$$

As a result, even when the frequency of the reference clock 126 is different from the data rate frequency f1 of the input data 120, the frequency of the output clock 127 from the VCO 107 can match the frequency f1. That is, in this case as well, the degree of freedom in selecting the reference clock 126 can be raised by setting the frequency dividing ratios n3 and n4 in accordance with the frequency of the reference clock 126 to be used. In this embodiment, the frequency to be handled by the phase comparator 106 is lower. This reduces the operation speed of the phase comparator 106 and therefore enables power saving.

The FIFO 101 stores the input data 120 using the recovered clock 123 from the VCO 102 and outputs the stored input data 120 in the input order using the recovered clock 127 from the VCO 107. Hence, recovered data 121 output from the FIFO 101 contains no jitter.

If the reference clocks 125 and 126 have the same frequency, a common clock source can be used. If the frequency of the reference clocks 125 and 126 is the same as that of a reference clock 122, the frequency dividers 104 and 105 are set to have the same frequency dividing ratio, and the frequency dividers 108 and 109 are set to have the same frequency dividing ratio. This makes it possible to operate the frequency comparator 103 and the phase comparator 106 at a low frequency and therefore enables power saving. In this case, the frequency dividers 108 and 109 may be omitted.

Third Embodiment

Figure 3:
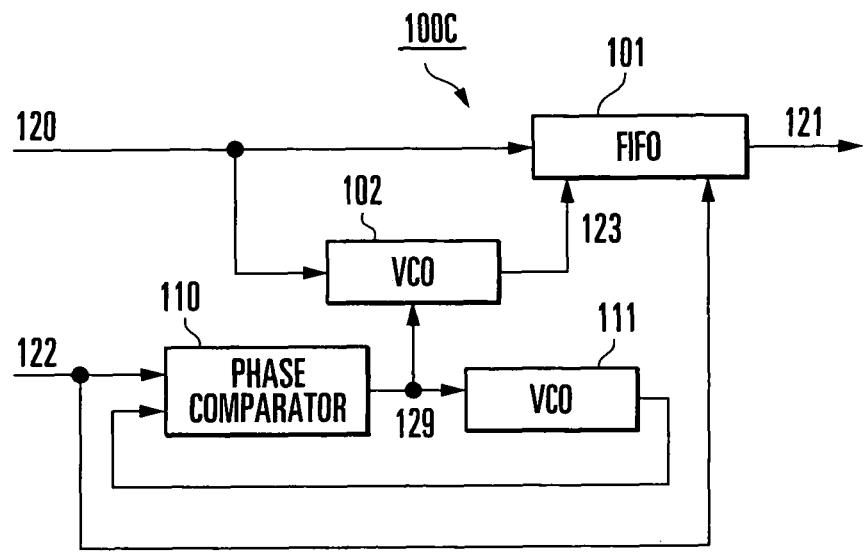
FIG. 3 is a block diagram showing the arrangement of a CDR circuit according to the third embodiment of the present invention.

FIG. 3 shows the arrangement of a CDR circuit 100C according to the third embodiment of the present invention. The same reference numerals as in FIG. 1 denote the same constituent elements in FIG. 3. Reference numeral 110 denotes a phase comparator; and 111, a VCO. A VCO 102, the phase comparator 110, and the VCO 111 form a recovered clock generation circuit.

The phase comparator 110 compares the phase of the output clock from the VCO 111 with that of a reference clock 122. A signal 129 representing the comparison result is input to the VCO 111 as a frequency control signal and also input to the VCO 102 as a frequency control signal.

In this embodiment, since the VCO 111 is used, the normal phase comparator 110 can be used in place of the frequency comparator 103 of the CDR circuit 100A shown in FIG. 1. The operation of this embodiment is the same as that of the CDR circuit shown in FIG. 1. Even when input data 120 contains jitter, recovered data 121 output from a FIFO 101 contains no jitter.

Fourth Embodiment

Figure 4:
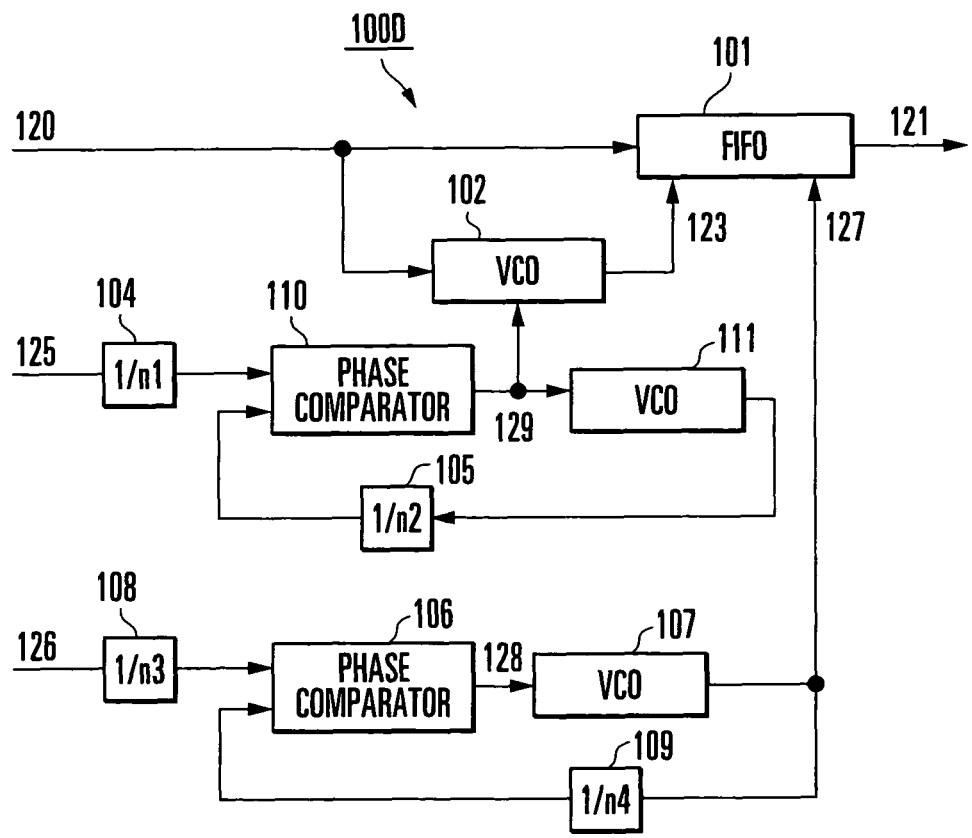
FIG. 4 is a block diagram showing the arrangement of a CDR circuit according to the fourth embodiment of the present invention.

FIG. 4 shows the arrangement of a CDR circuit 100D according to the fourth embodiment of the present invention. The same reference numerals as in FIG. 3 denote the same constituent elements in FIG. 4. In this embodiment, frequency dividers 104 and 105 are inserted to both input sides of a phase comparator 110 in the CDR circuit 100C shown in FIG. 3. A phase comparator 106 and a VCO 107, which form a PLL circuit, are newly added. Frequency dividers 108 and 109 are also inserted to both input sides of the phase comparator 106. Reference numerals 125 and 126 denote reference clocks.

In this embodiment, frequency dividing ratios n1 and n2 of the frequency dividers 104 and 105 are set in accordance with the frequency of the reference clock 125, thereby increasing the degree of freedom in selecting the reference clock 125, like the CDR circuit 100B shown in FIG. 2. Additionally, the frequency to be handled by the phase comparator 110 is lower. This enables power saving. Similarly, frequency dividing ratios n3 and n4 are set in accordance with the frequency of the reference clock 126, thereby increasing the degree of freedom in selecting the reference clock 126. The frequency to be handled by the phase comparator 106 is lower. This enables power saving. Even when input data 120 contains jitter, recovered data 121 output from a FIFO 101 contains no jitter.

If the reference clocks 125 and 126 have the same frequency, a common clock source can be used. If the frequency of the reference clocks 125 and 126 is the same as that of a reference clock 122, the frequency dividers 104 and 105 are set to have the same frequency dividing ratio, and the frequency dividers 108 and 109 are set to have the same frequency dividing ratio. This makes it possible to operate a frequency comparator 103 and the phase comparator 106 at a low frequency and therefore enables power saving. In this case, the frequency dividers 108 and 109 may be omitted.

Fifth Embodiment

Figure 5:
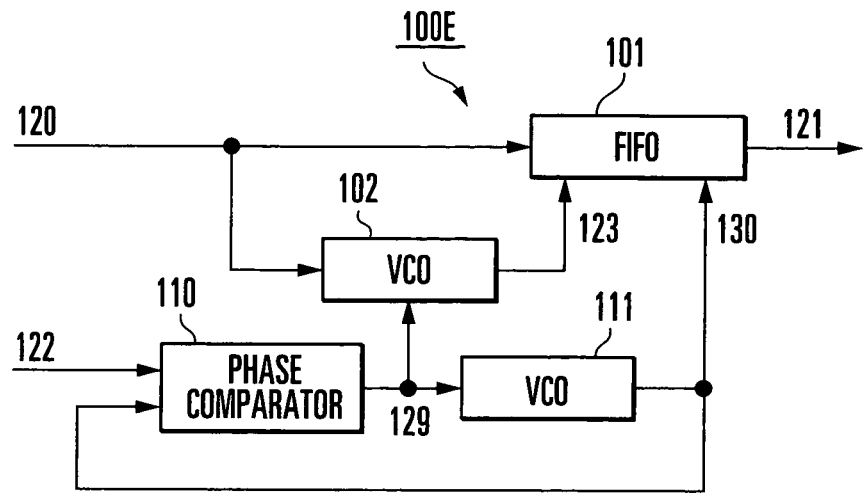
FIG. 5 is a block diagram showing the arrangement of a CDR circuit according to the fifth embodiment of the present invention.

FIG. 5 shows the arrangement of a CDR circuit 100E according to the fifth embodiment of the present invention. The same reference numerals as in FIG. 3 denote the same constituent elements in FIG. 5. In this embodiment, not a reference clock 122 but an output clock 130 from a VCO 111 is used as the read clock of a FIFO 101 in the CDR circuit 100C shown in FIG. 3. A recovered clock 123 from a VCO 102 is affected by jitter contained in input data 120. However, the output clock 130 from the VCO 111 is not affected. Hence, even when the input data 120 contains jitter, recovered data 121 output from the FIFO 101 contains no jitter.

Sixth Embodiment

Figure 6:
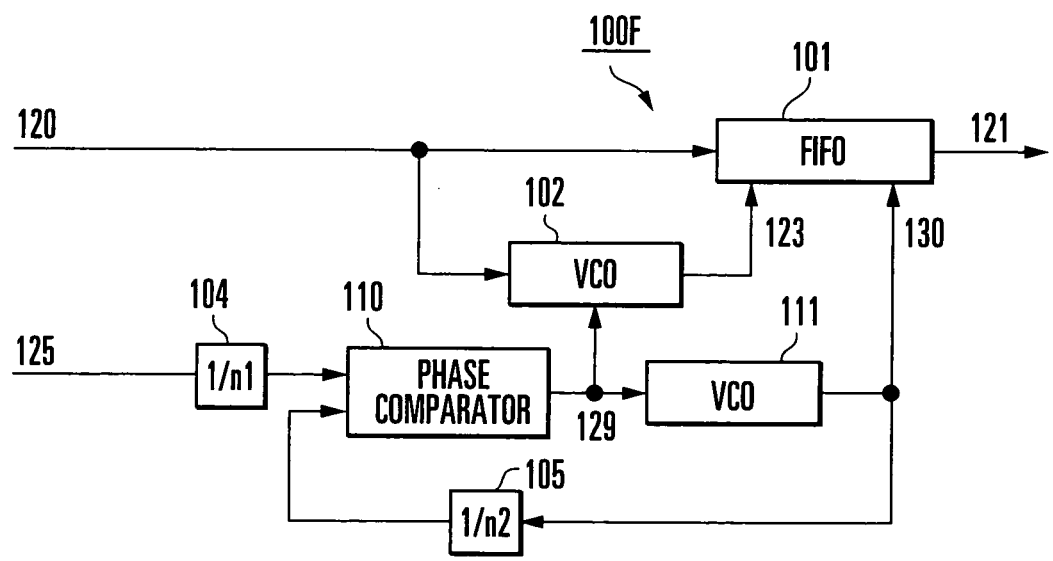
FIG. 6 is a block diagram showing the arrangement of a CDR circuit according to the sixth embodiment of the present invention.

FIG. 6 shows the arrangement of a CDR circuit 100F according to the sixth embodiment of the present invention. The same reference numerals as in FIG. 5 denote the same constituent elements in FIG. 6. In this embodiment, frequency dividers 104 and 105 are inserted to both input sides of a phase comparator 110 in the CDR circuit 100F shown in FIG. 5. A reference clock 125 is input to the frequency divider 104.

In this embodiment, frequency dividing ratios n1 and n1 are set in accordance with the frequency of the reference clock 125, thereby increasing the degree of freedom in selecting the reference clock 125. Additionally, the frequency to be handled by the phase comparator 110 is lower. This enables power saving. Even when input data 120 contains jitter, recovered data 121 output from a FIFO 101 contains no jitter.

The frequency of the reference clock 125 may be the same as that of a reference clock 122. In this case, the frequency dividers 104 and 105 are set to have the same frequency dividing ratio. This makes it possible to operate a phase comparator 106 at a low frequency and therefore enables power saving.

Seventh Embodiment

FIG. 7 shows the arrangement of a CDR circuit 100G according to the seventh embodiment of the present invention. The same reference numerals as in FIG. 1 denote the same constituent elements in FIG. 7. In this embodiment, a reset signal generation circuit 112 formed from a CR time constant circuit is added to the CDR circuit 100A shown in FIG. 1. Upon detecting continuous input of identical codes for a preset time or more or continuous input of identical codes corresponding to a preset number of bits or more in input data 120, the reset signal generation circuit 112 resets a FIFO 101. The FIFO 101 can be reset when no data arrives at it. This prevents overflow or shortage of the FIFO 101.

Eighth Embodiment

FIG. 8 shows the arrangement of a CDR circuit 100H according to the eighth embodiment of the present invention. The same reference numerals as in FIG. 3 denote the same constituent elements in FIG. 8. In this embodiment, a reset signal generation circuit 112 is added to the CDR circuit 100C shown in FIG. 3. The reset signal generation circuit 112 is the same as that described with reference to FIG. 7 and operates in the same way as in the CDR circuit 100G shown in FIG. 7.

Ninth Embodiment

FIG. 9 shows the arrangement of a CDR circuit 100I according to the ninth embodiment of the present invention. The same reference numerals as in FIG. 5 denote the same constituent elements in FIG. 9. In this embodiment, a reset signal generation circuit 112 is added to the CDR circuit 100E shown in FIG. 5. The reset signal generation circuit 112 is the same as that described with reference to FIG. 7 and operates in the same way as in the CDR circuit 100G shown in FIG. 7.

10th Embodiment

FIG. 10 shows the arrangement of a CDR circuit 100J according to the 10th embodiment of the present invention. The same reference numerals as in FIG. 1 denote the same constituent elements in FIG. 10. In this embodiment, a reset signal generation circuit 113 formed from a counter is added to the CDR circuit 100A shown in FIG. 1. Upon detecting continuous input of identical codes for a preset time or more or continuous input of identical codes corresponding to a preset number of bits or more in input data 120, the reset signal generation circuit 113 resets a FIFO 101. The FIFO 101 can be reset when no data arrives at it. The reset signal generation circuit 113 generates a reset signal upon continuously counting a predetermined number of identical codes using a write clock 123 for the FIFO 101 as a clock.

11th Embodiment

Figure 11:
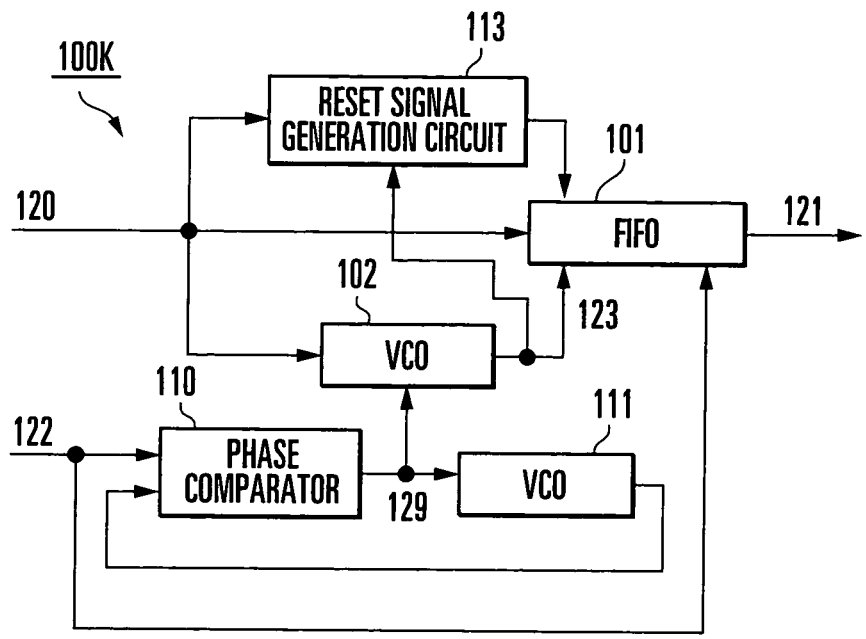
FIG. 11 is a block diagram showing the arrangement of a CDR circuit according to the 11th embodiment of the present invention.

FIG. 11 shows the arrangement of a CDR circuit 100K according to the 11th embodiment of the present invention. The same reference numerals as in FIG. 3 denote the same constituent elements in FIG. 11. In this embodiment, a reset signal generation circuit 113 is added to the CDR circuit 100C shown in FIG. 3. The reset signal generation circuit 113 is the same as that described with reference to FIG. 10 and operates in the same way as in the CDR circuit 100J shown in FIG. 10.

12th Embodiment

Figure 12:
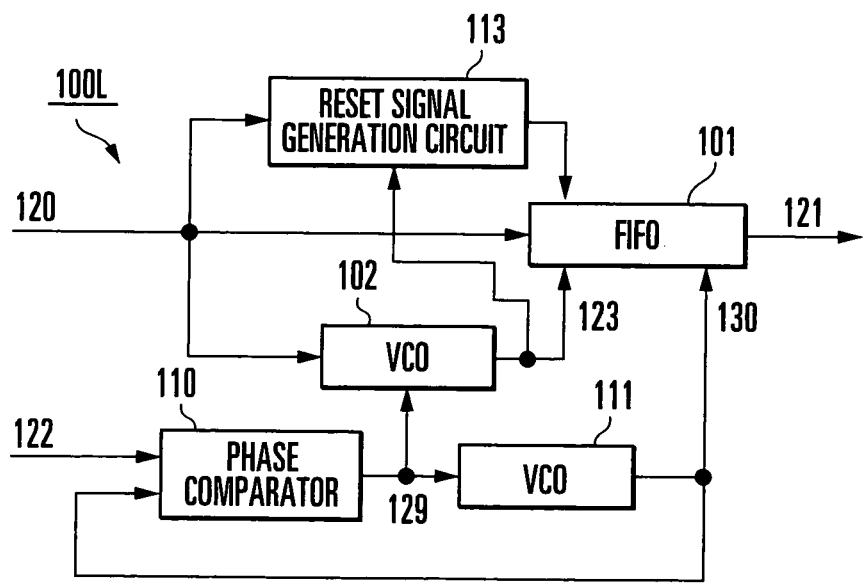
FIG. 12 is a block diagram showing the arrangement of a CDR circuit according to the 12th embodiment of the present invention.

FIG. 12 shows the arrangement of a CDR circuit 100L according to the 12th embodiment of the present invention. The same reference numerals as in FIG. 5 denote the same constituent elements in FIG. 12. In this embodiment, a reset signal generation circuit 113 is added to the CDR circuit 100E shown in FIG. 5. The reset signal generation circuit 113 is the same as that described with reference to FIG. 10 and operates in the same way as in the CDR circuit 100J shown in FIG. 10.

13th Embodiment

Figure 13:
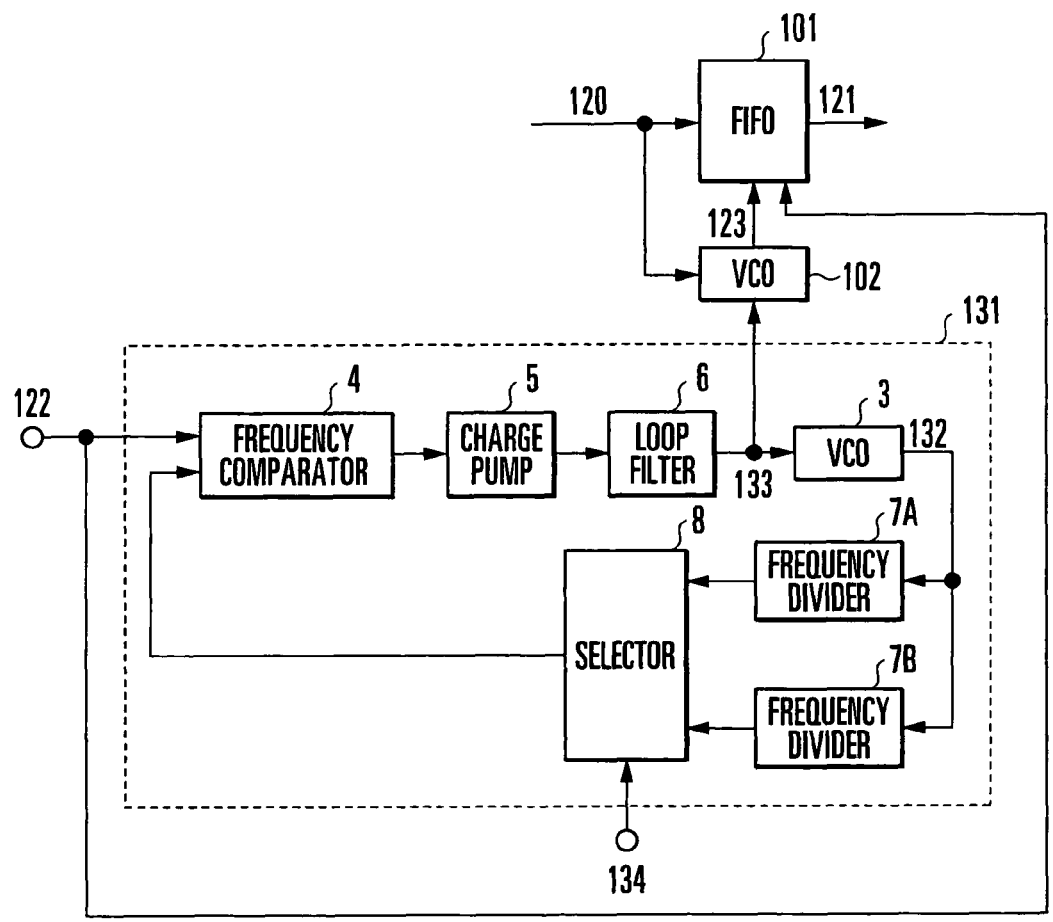
FIG. 13 is a block diagram showing the arrangement of a CDR circuit according to the 13th embodiment of the present invention.

FIG. 13 shows the arrangement of a CDR circuit according to the 13th embodiment of the present invention. The same reference numerals as in FIG. 1 denote the same constituent elements in FIG. 13. Referring to FIG. 13, reference numeral 101 denotes a FIFO; 102, a VCO; 120, input data; 121, recovered data; 122, a reference clock; and 131, a PLL circuit. The VCO 102 and the PLL circuit 131 form a recovered clock generation circuit.

The PLL circuit 131 includes a VCO 3 having the same circuit arrangement as the VCO 102, a frequency comparator 4, a charge pump 5, a loop filter 6, frequency dividers 7A and 7B, and a selector 8.

In this embodiment, the output signal from the VCO 3 is input to the two frequency dividers 7A and 7B having different frequency dividing ratios. The selector 8 selects one of the outputs from the frequency dividers 7A and 7B in accordance with a switching signal 134 and outputs the selected signal to the frequency comparator 4.

The input data 120 is input to the VCO 102 and the FIFO 101. The VCO 102 performs adjustment to make the phase of the oscillation waveform match that of the input data 120 at the transition timing of the voltage value of the input data 120, thereby recovering a clock 123. The recovered clock 123 output from the VCO 102 is input to the FIFO 101.

A control signal 133 that controls the frequency of an oscillated clock 132 from the VCO 3 is also simultaneously supplied to the VCO 102 to control the VCOs 102 and 3 to output the oscillated clocks 123 and 132 having the same frequency. The output signal from the VCO 3 is frequency-divided by the frequency divider 7A or 7B and input to the frequency comparator 4 via the selector 8. The frequency comparator 4 compares the phase of the reference clock 122 with that of the signal input from the selector 8 and outputs a signal corresponding to the difference. The charge pump 5 outputs a current corresponding to the signal output from the frequency comparator 4. The loop filter 6 determines the frequency control signal 133 to control the VCOs 102 and 3 in accordance with the output from the charge pump 5.

As described above, in this embodiment, the two frequency dividers 7A and 7B are switched by the selector 8 and used. Within the range of frequencies oscillable by the VCOs 102 and 3, even the input data 120 having different bit rates can be retimed. That is, according to this embodiment, the frequency of the recovered clock 123 to recover the input data 120 in the FIFO 101 can be switched. This enables to recover the input data 120 having two or more different bit rates. In this embodiment, only one reference clock 122 suffices. In this embodiment, the two frequency dividers 7A and 7B are used. However, one of three or more frequency dividers may be selected.

14th Embodiment

Figure 14:
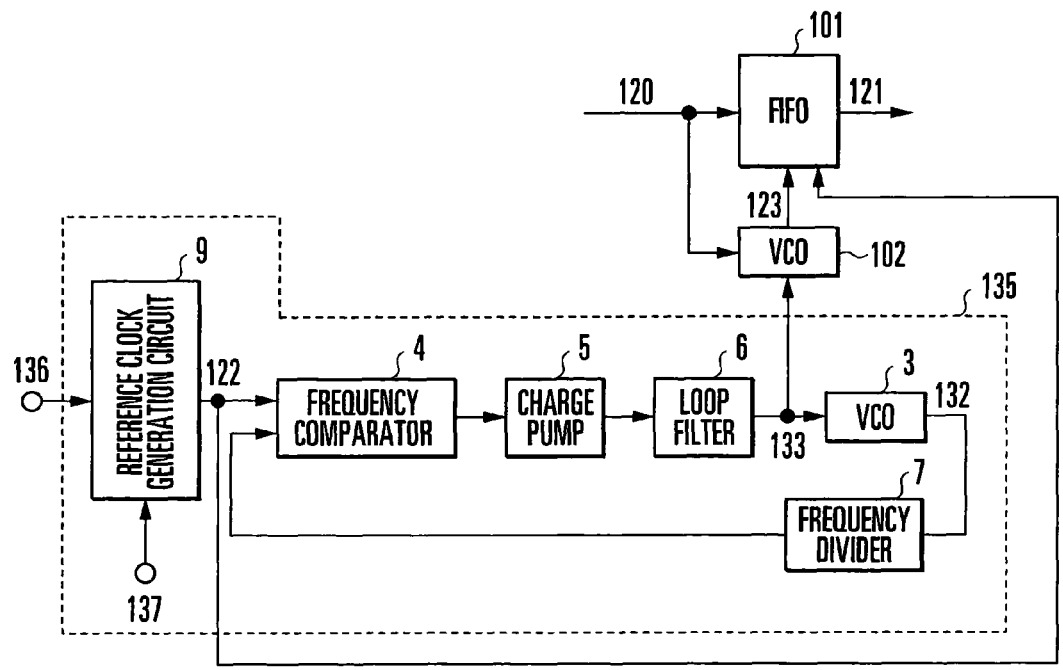
FIG. 14 is a block diagram showing the arrangement of a CDR circuit according to the 14th embodiment of the present invention.

FIG. 14 shows the arrangement of a CDR circuit according to the 14th embodiment of the present invention. The same reference numerals as in FIG. 13 denote the same constituent elements in FIG. 14. Referring to FIG. 14, reference numeral 135 denotes a PLL circuit; 7, a frequency divider; and 9, a reference clock generation circuit. In this embodiment, the reference clock generation circuit 9 is used, which receives one reference clock 136 and generates a reference clock 122 in accordance with a setting signal 137. The reference clock generation circuit 9 inputs the reference clock 122 to a frequency comparator 4 and a FIFO 101. The reference clock generation circuit 9 can be implemented using an integer- or fractional-type PLL circuit.

As described above, in this embodiment, the reference clock generation circuit 9 generate the reference clock 122 having a desired frequency. Within the range of frequencies oscillable by VCOs 102 and 3, even input data 120 having different bit rates can be retimed. In this embodiment, only one reference clock 122 suffices. Only one frequency divider also suffices.

15th Embodiment

Figure 15:
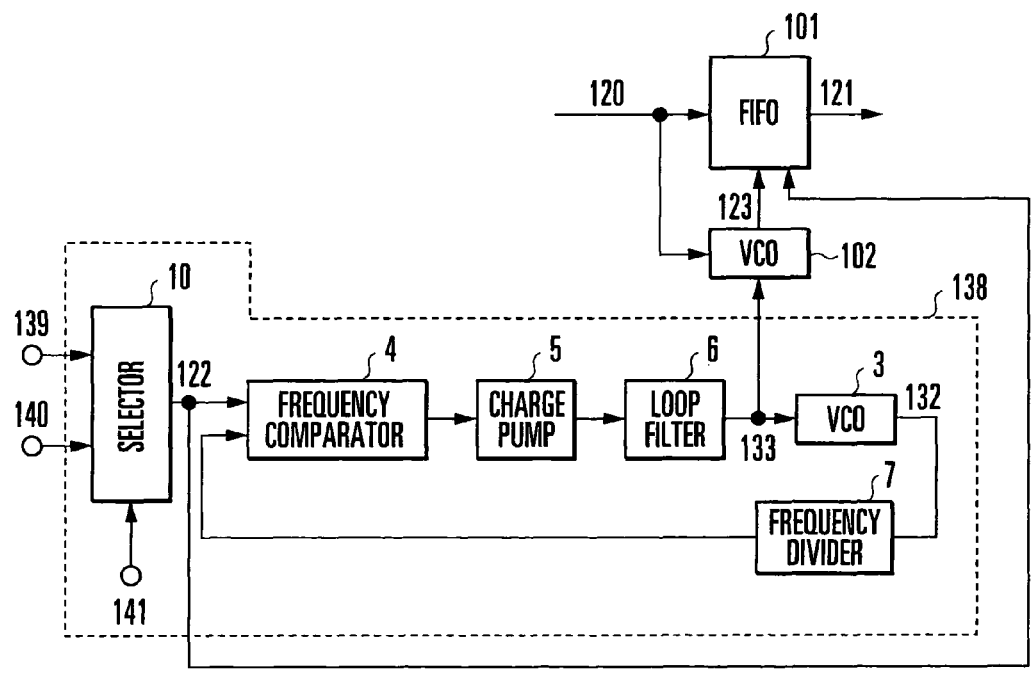
FIG. 15 is a block diagram showing the arrangement of a CDR circuit according to the 15th embodiment of the present invention.

FIG. 15 shows the arrangement of a CDR circuit according to the 15th embodiment of the present invention. The same reference numerals as in FIG. 14 denote the same constituent elements in FIG. 15. Referring to FIG. 15, reference numeral 138 denotes a PLL circuit; and 10, a selector. In this embodiment, two reference clocks 139 and 140 are used. The selector 10 selects one of the reference clocks 139 and 140 in accordance with a switching signal 141 and inputs the selected clock to a frequency comparator 4 and a FIFO 101 as a reference clock 122.

As described above, in this embodiment, the two reference clocks 139 and 140 are switched by the selector 10 and used. Within the range of frequencies oscillable by VCOs 102 and 3, even input data 120 having different bit rates can be retimed. Additionally, even after IC development, the frequency can be changed. In this embodiment, the two reference clocks 139 and 140 are used. However, one of three or more reference clocks may be selected.

16th Embodiment

Figure 16:
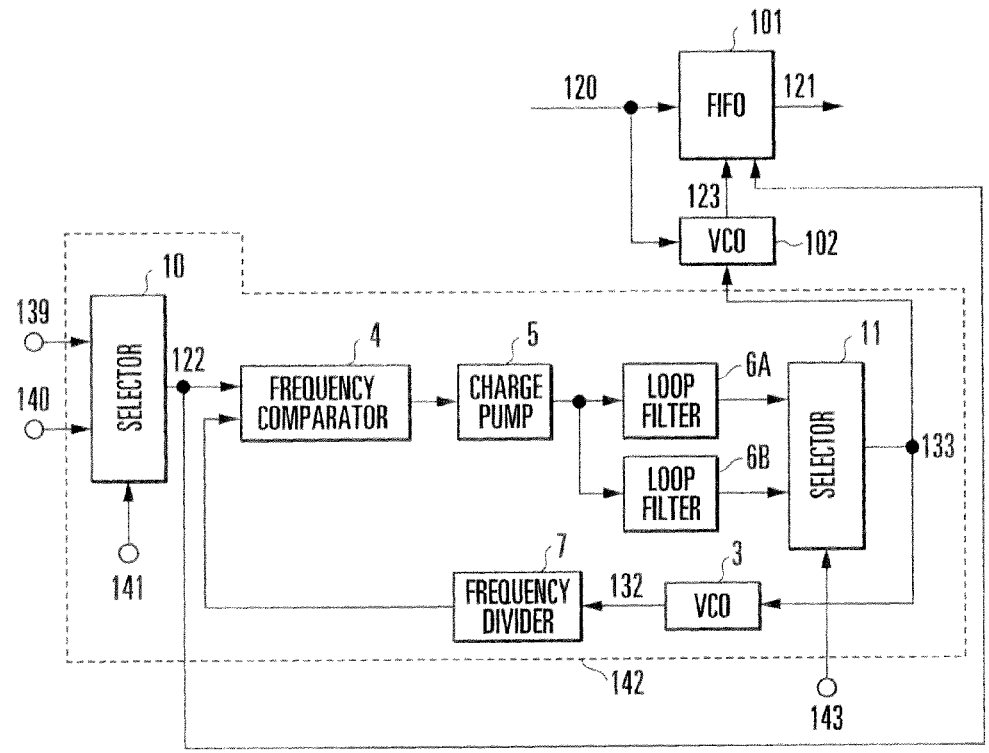
FIG. 16 is a block diagram showing the arrangement of a CDR circuit according to the 16th embodiment of the present invention.
Figure 17:
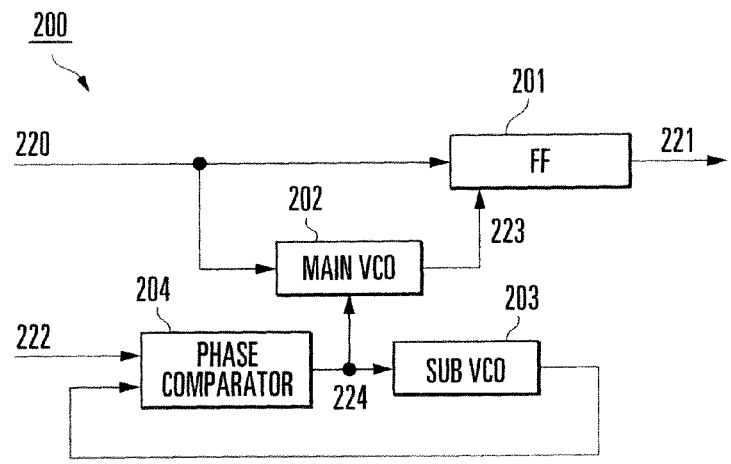
FIG. 17 is a block diagram showing the arrangement of a conventional CDR circuit.

FIG. 16 shows the arrangement of a CDR circuit according to the 16th embodiment of the present invention. The same reference numerals as in FIG. 15 denote the same constituent elements in FIG. 16. Referring to FIG. 16, reference numeral 142 denotes a PLL circuit; and 11, a selector. In this embodiment, two loop filters 6A and 6B having different time constants are arranged in the PLL circuit of the CDR circuit of the 15th embodiment. The selector 11 selects one of the output signals from the loop filters 6A and 6B in accordance with a switching signal 143 and outputs the selected signal as a frequency control signal 133.

In this embodiment, the configurations and filter contents of the two loop filters 6A and 6B are determined in accordance with the bit rate of input data 120 or the system requirements. One of the loop filters 6A and 6B is selected in accordance with the input data 120.

The arrangement that switches the loop filter is applicable not only to the CDR circuit shown in FIG. 15 but also to the CDR circuit described with reference to FIGS. 13 to 14. In this case as well, the loop filters are not limited to the two loop filters 6A and 6B. One of three or more loop filters may be selected.

The above-described 13th to 15th embodiments can also be combined with each other. This allows to diversify the types of frequencies of the clocks 123 and 132 oscillated by the VCOs 102 and 3.

INDUSTRIAL APPLICABILITY

The present invention is applicable to a technique of extracting a clock in phase with input data and retiming the input data based on the clock.

The invention claimed is:

1. A CDR circuit comprising:
a recovered clock generation circuit which receives a first reference clock having the same frequency as a data rate frequency of input data and generates a recovered clock in phase with the input data; and
a data write/read circuit which writes the input data using the recovered clock as a write clock, and reads out the input data using, as a read clock, a clock which has the same frequency as the recovered clock and is asynchronous to the recovered clock,
wherein said recovered clock generation circuit comprises:
a first VCO which generates the recovered clock, the first VCO having an oscillation frequency controlled in accordance with a first frequency control signal and an oscillation phase controlled at a voltage transition point of the input data; and
a frequency comparator which compares the frequency of the first reference clock with the frequency of the recovered clock and outputs a signal of a comparison result as the first frequency control signal;
a first frequency divider which frequency-divides a second reference clock having a frequency equal to or different from the data rate frequency of the input data;
a second VCO which outputs, as the read clock of said data write/read circuit, an output clock whose oscillation frequency is controlled in accordance with a second frequency control signal;
a second frequency divider which frequency-divides an output clock from said second VCO; and
a phase comparator which compares a phase of a clock input from said first frequency divider with a phase of a clock input from said second frequency divider, and outputs a signal of a comparison result as the second frequency control signal.

2. A CDR circuit comprising:
a recovered clock generation circuit which receives a first reference clock having the same frequency as a data rate frequency of input data and generates a recovered clock in phase with the input data; and
a data write/read circuit which writes the input data using the recovered clock as a write clock, and reads out the input data using, as a read clock, a clock which has the same frequency as the recovered clock and is asynchronous to the recovered clock,
wherein the said recovered clock generation circuit comprises:
a first VCO which generates the recovered clock, the first VCO having an oscillation frequency controlled in accordance with a first frequency control signal and an oscillation phase controlled at a voltage transition point of the input data;
a second VCO having an oscillation frequency controlled in accordance with the first frequency control signal;
a first phase comparator which compares the phase of the first reference clock with a phase of an output clock from said second VCO and outputs a signal of a comparison result as the first frequency control signal;
a first frequency divider which frequency-divides a second reference clock having a frequency equal to or different from the data rate frequency of the input data and outputs the first reference clock to said first phase comparator; and
a second frequency divider which is provided between said second VCO and said first phase comparator, frequency-divides the output from said second VCO, and outputs the frequency-divided output to said first phase comparator.

3. A CDR circuit according to claim 2, characterized in that said data write/read circuit uses the output clock from said second VCO as the read clock.

4. A CDR circuit comprising:
a recovered clock generation circuit which receives a first reference clock having the same frequency as a data rate frequency of input data and generates a recovered clock in phase with the input data; and
a data write/read circuit which writes the input data using the recovered clock as a write clock, and reads out the input data using, as a read clock, a clock which has the same frequency as the recovered clock and is asynchronous to the recovered clock,
characterized in that said recovered clock generation circuit comprises:
a first VCO which generates the recovered clock, the first VCO having an oscillation frequency controlled in accordance with a first frequency control signal and an oscillation phase controlled at a voltage transition point of the input data;
a second VCO having an oscillation frequency controlled in accordance with the first frequency control signal;
a first phase comparator which compares the phase of the first reference clock with a phase of an output clock from said second VCO and outputs a signal of a comparison result as the first frequency control signal;
a first frequency divider which frequency-divides a second reference clock having a frequency equal to or different from the data rate frequency of the input data;
a third VCO which outputs, as the read clock of said data write/read circuit, an output clock whose oscillation frequency is controlled in accordance with a second frequency control signal;
a second frequency divider which frequency-divides an output clock from said third VCO; and
a second phase comparator which compares a phase of a clock input from said first frequency divider with a phase of a clock input from said second frequency divider, and outputs a signal of a comparison result as the second frequency control signal.

5. A CDR circuit comprising:
a recovered clock generation circuit which receives a first reference clock having the same frequency as a data rate frequency of input data and generates a recovered clock in phase with the input data; and
a data write/read circuit which writes the input data using the recovered clock as a write clock, and reads out the input data using, as a read clock, a clock which has the same frequency as the recovered clock and is asynchronous to the recovered clock,
characterized in that said recovered clock generation circuit comprises:
a first VCO which generates the recovered clock, the first VCO having an oscillation frequency controlled in accordance with a frequency control signal and an oscillation phase controlled at a voltage transition point of the input data; and
a PLL circuit which outputs the frequency control signal corresponding to the frequency of the first reference clock, said PLL circuit comprising:
a second VCO having an oscillation frequency controlled in accordance with the frequency control signal;
a frequency divider which frequency-divides an output clock from said second VCO;
a frequency comparator which compares the frequency of the first reference clock with a frequency of a clock input from said frequency divider;
a charge pump which increases/decreases an output current amount in accordance with a signal of a comparison result of said frequency comparator;
a loop filter which generates the frequency control signal by integrating a output from said charge pump; and
a variable circuit which changes one of a frequency dividing ratio of said frequency divider and the frequency of the first reference clock.

6. A CDR circuit according to claim 5, characterized in that said frequency divider includes a plurality of frequency dividers having different frequency dividing ratios, and said variable circuit includes a selector which selects one of said plurality of frequency dividers and outputs an output clock from said selected frequency divider to said frequency comparator.

7. A CDR circuit according to claim 5, characterized in that said variable circuit includes a reference clock generation circuit which generates a clock having a frequency switched in accordance with a setting signal, and outputs the clock as the first reference clock.

8. A CDR circuit according to claim 5, characterized in that said variable circuit includes a selector which selects one of a plurality of clocks having different frequencies and outputs the selected clock as the first reference clock.

9. A CDR circuit according to claim 5, characterized in that said loop filter includes a plurality of loop filters dividers having different time constants, and said PLL circuit further comprises a selector which selects one of said plurality of loop filters and outputs an output from said selected loop filter as the frequency control signal.

* * * * *